United States Patent [19]
Nikhade et al.

[11] Patent Number: 6,011,445
[45] Date of Patent: Jan. 4, 2000

[54] METHOD FOR OSCILLATING AND START UP CIRCUIT FOR OSCILLATOR

[75] Inventors: Vaishali Nikhade; Khosrow Sadeghi, both of Irvine, Calif.

[73] Assignee: ADMTEK Incorporated, Hsinchu, Taiwan

[21] Appl. No.: 09/144,205

[22] Filed: Aug. 1, 1998

[51] Int. Cl.[7] .............................. H03B 5/24; H03B 5/06; H03L 7/099; H03L 7/113
[52] U.S. Cl. ........................... 331/173; 331/1 A; 331/11; 331/57; 331/74; 327/142; 327/156; 327/159
[58] Field of Search ................................ 331/1 A, 10, 11, 331/57, 74, 173; 327/142, 143, 156–159

[56] References Cited

U.S. PATENT DOCUMENTS

| | | | |
|---|---|---|---|
| 5,347,232 | 9/1994 | Nishimichi | 331/1 A |
| 5,534,826 | 7/1996 | Logan | 331/158 |

OTHER PUBLICATIONS

Yasuo Tsuzuki, et al., "Fast Start–up crystal oscillator circuits,", Proceedings of the 49th th Annual IEEE International Frequency Control Symposium, May 1995, pp. 565–568.

*Primary Examiner*—David Mis
*Attorney, Agent, or Firm*—Laff, Whitesel & Saret, Ltd.; J. Warren Whitesel

[57] ABSTRACT

The present invention provides a reliable method for oscillating an oscillator having an oscillator output without fail. The method includes steps of detecting whether the oscillator is regularly oscillating, and releasing the oscillator to oscillate when the oscillator is regularly oscillating, and holding the oscillator from oscillating until an enough control voltage is built-up therefor when the oscillator is not regularly oscillating. The present invention also provides a start up circuit for an oscillator having an oscillator output having a first state in a first instance and a second state in a second instance. The start up circuit includes a detecting device which includes a first input end for inputting therethrough the oscillator output, and a detecting output having a third state in a third instance and a fourth state in a fourth instance such that when the detecting output is in the third state, the oscillator is in a first work mode, and when the detecting output is in the fourth state, the oscillator is in a second work mode.

36 Claims, 4 Drawing Sheets

METHOD FOR OSCILLATING AND START UP CIRCUIT FOR OSCILLATOR

FIELD OF THE INVENTION

The present invention relates to an oscillator, and more particularly to a start up circuit therefor.

BACKGROUND OF THE INVENTION

It is well known in the art that many oscillators have a stable (or non-oscillating) region of operation so that the oscillator circuits may not start up reliably. In other words, if the oscillator starts up in a random fashion, it may never oscillate. This explains why a start up circuit is normally required.

Another problem associated with the start up procedure for the oscillator is with the reference crystal. That is, the amplitude of the reference crystal attains a steady state after the power supply Vdd has reached a stable value. If the oscillator, which can be a voltage controlled oscillator (VCO) or a current controlled oscillator (ICO), tries to lock to the reference crystal during the transition period, it might enter the non-oscillating region of operation and thus never oscillates. This necessitates the provision of another start up circuit.

Various efforts have been made to guarantee the reliable start up of oscillator circuits. The start up circuit for an oscillator ensures that the oscillator always starts up in the proper region of operation during the power up procedure in order to regularly oscillate.

U.S. Pat. No. 5,534,826 issued to Shawn M. Logan provides a technique where the crystal connection to the crystal resonator is changed. This method guarantees the fast start up of the crystal oscillator. Fast start up of the reference crystal, however, does not guarantee the desired start up of a phase locked loop (PLL) oscillator (ICO/VCO).

One prior art technique is mentioned by Yasuo Tsuzuki, Takehiko Adachi and H Wen Zhang in an article entitled "Fast start-up crystal oscillator circuits," Proceedings of 49$^{th}$ Annual IEEE International Frequency Control Symposium, May 1995, pages 565–568. In this article, the gain of the oscillator circuit is increased at the start up stage by reducing the value of a user controlled impedance until the oscillation commences. This method, however, does not guarantee to take the oscillator out of its stable region if it is already in the stable region.

An alternative start up operation can also be established by using two circuits. The first stage consists of a Vdd detect circuit to detect the value of Vdd. The second stage consists of a circuit to detect the amplitude of the reference crystal. The trigger signal from the second stage enables the normal operation of the oscillator. Essentially, the oscillator is held in a stopped state until the reference crystal has reached the steady state. To detect a value of Vdd greater than Vdd/2 for all process corners and temperature, however, a large capacitor is required for the first stage. In addition, the amplitude detect stage for the reference crystal requires a large number of gates. Eventually, both these circuits occupy a large area.

It is therefore tried by the Applicant to deal with the above situations encountered in the prior art.

SUMMARY OF THE INVENTION

It is therefore an object of the present invention to provide a method of ensuring oscillations for an oscillator for alleviating problems associated with a non-oscillating voltage controlled oscillator/current controlled oscillator (VCO/ICO).

It is further an object of the present invention to provide a single start up circuit for both Vdd detection and crystal output detection.

It is additional an object of the present invention to provide a start up circuit which occupies a relatively small silicon area.

It is more an object of the present invention to provide a start-up circuit with no process compensation.

It is still an object of the present invention to provide a reliable oscillating device which prevents the oscillator from entering into a non-oscillating stable region by tracking a low amplitude crystal clock if the reference crystal has not reached a stable operating point during the power up procedure.

It is yet an object of the present invention to provide a start up circuit for automatically triggering the oscillating to regularly oscillate if it starts operating in the stable region after power up/reset.

It is one more object of the present invention to provide an area efficient, simple and desired start up circuit for oscillators.

According to an aspect of the present invention, a reliable oscillating device includes an oscillator having an oscillator output having a first state in a first instance and a second state in a second instance, and a detecting device electrically connected to the oscillator, detecting which one of the first and second states the oscillator output is in, and having a detecting output having a third state in a third instance and a fourth state in a fourth instance such that when the detecting output is in the third state, the oscillator is in a first work mode, and when the detecting output is in the fourth state, the oscillator is in a second work mode.

Certainly, voltage states of the third state and the fourth state can be respectively low and high. When the detecting output is in the third state, the oscillator output is in the first state, and when the detecting output is in the fourth state, the oscillator output is in the second state. Voltage states of the first state and the second state can respectively be low and high.

Certainly, the first work mode and the second work mode can be respectively an oscillatory mode and a fixed mode. In the oscillatory mode, the oscillator oscillates in a manner that the oscillator is assumed to oscillate. Whereas, in the fixed mode, the oscillator does not oscillate. During power-up/reset, the oscillator oscillates at a frequency lower than that at which the oscillator is assumed to oscillate. In such a situation, the detecting output keeps changing between the third state and the fourth state.

Preferably the detecting device includes a counter which can be a ripple counter which can be an n bit down counter for counting $2^n$ clock cycles, and has a most significant bit (MSB) wherein n can be 4.

Preferably the detecting device further includes an inverter for inverting a logic state of the most significant bit to provide the detecting output.

Preferably the oscillator is a differential oscillator which can be a five stage basic differential ring oscillator.

Preferably the present device further includes a 20 MHz reference crystal.

Certainly, the present device can be incorporated into a phase locked loop circuit device which can include a phase detector, a charge pump and a loop filter.

Certainly, in the present device, the oscillator can have an output used as an input to the phase detector.

In accordance with another another aspect of the present invention, a start up circuit adapted to be used with an oscillator having an oscillator output having a first state in a first instance and a second state in a second instance includes a detecting device which includes a first input end for inputting therethrough the oscillator output, and a detecting output having a third state in a third instance and a fourth state in a fourth instance such that when the detecting output is in the third state, the oscillator is in a first work mode, and when the detecting output is in the fourth state, the oscillator is in a second work mode.

Generally the detecting device further includes a second input for inputting therethrough a crystal clock.

Certainly, the detecting device can include a counter which can be an n bit down counter for counting $2^n$ clock cycles, and has a most significant bit (MSB).

Preferably the detecting device further includes an inverter for inverting a logic state of the most significant bit to provide the detecting output.

Certainly, the oscillator can be a differential oscillator, and can provide the oscillator output through a differential to single-ended conversion.

In accordance with a third aspect of the present invention, a method for oscillating an oscillator having an oscillator output includes steps of detecting whether the oscillator is regularly oscillating, and allowing the oscillator to oscillate when the oscillator is regularly oscillating, and holding the oscillator from oscillating until an enough control voltage is built-up therefor when the oscillator is not regularly oscillating.

Certainly, in the present method, the steps can be performed by a detecting device which includes a first input end for inputting therethrough the oscillator output having a first state in a first instance and a second state in a second instance, and a detecting output having a third state in a third instance and a fourth state in a fourth instance such that when the detecting output is in the third state, the oscillator is in a first work mode, and when the detecting output is in the fourth state, the oscillator is in a second work mode.

Certainly, the first work mode and the second work mode can be respectively an oscillatory mode and a fixed mode. In the fixed mode, the oscillator does not oscillate. During power-up/reset, the oscillator oscillates at a frequency lower than that at which the oscillator is required to oscillate.

Certainly, the detecting device includes a counter.

Generally when the oscillator is in the fixed mode, the control voltage is rising.

Normally the counter will periodically count until the enough control voltage is obtained.

Certainly the counter can count 16 clocks as a period.

The present invention may best be understood through the following descriptions with reference to the accompanying drawings, in which:

DETAILED DESCRIPTION OF THE PREFERRED EMBODIMENT

Figure 1:
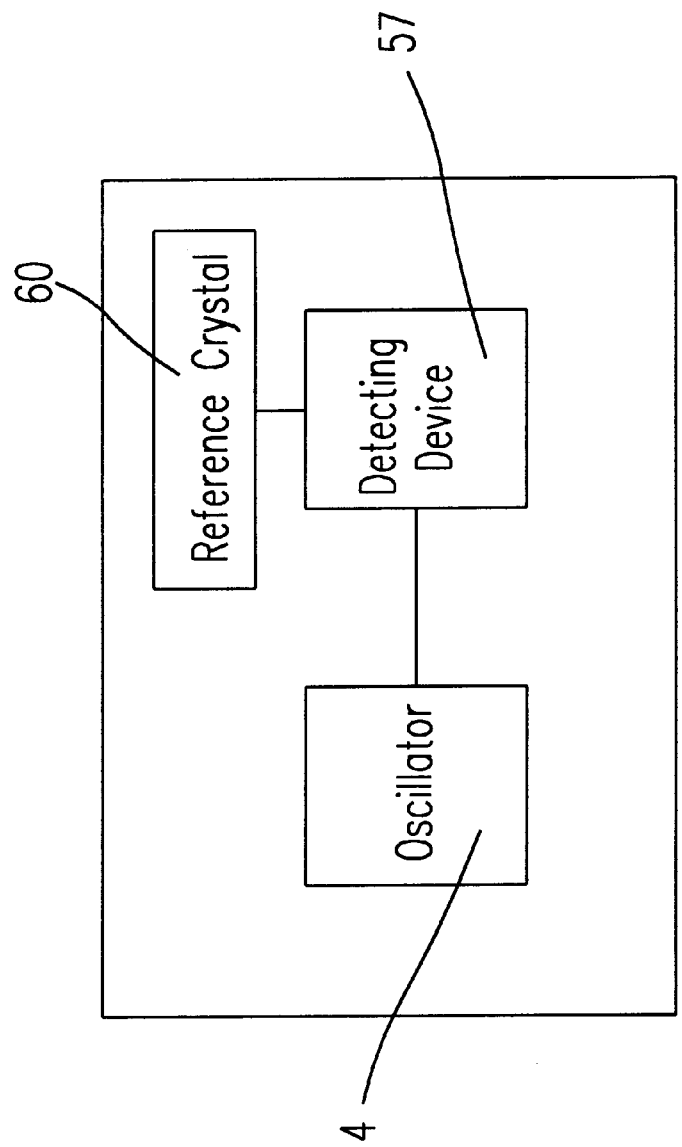
FIG. 1 is a schematical structural diagram showing a general architecture of a reliable oscillating device according to the present invention.

As shown in FIG. 1, a basic structure of a reliable oscillating device according to the present invention includes an oscillator 4 having an oscillator output having a first state in a first instance and a second state in a second instance, and a detecting device 57 electrically connected to oscillator 4, detecting which one of the first and second states the oscillator output is in, and having a detecting output having a third state in a third instance and a fourth state in a fourth instance such that when the detecting output is in the third state, oscillator 4 is in a first work mode, and when the detecting output is in the fourth state, oscillator 4 is in a second work mode. In a specific embodiment, detecting device 57 includes a counter 5, as shown in FIG. 2, clocked by a reference crystal 60.

Figure 2:
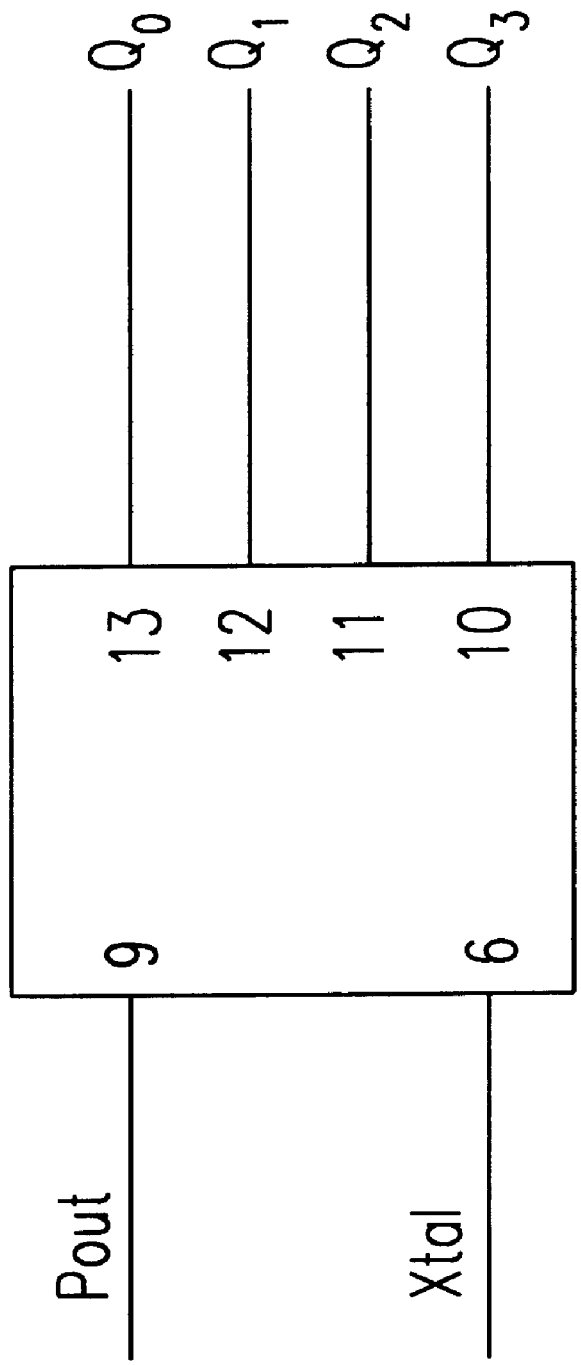
FIG. 2 is a schematical view showing a counter used for a reliable oscillating device in FIG. 1.

As shown in FIG. 2, counter 5 with n (in this particular instance, 4) bits is clocked by the clock signal 6 generated by reference crystal 60. Although any type of counter can be used, a ripple counter has been used for illustration. 4-bit ripple counter 5 is used to detect the frequency of oscillation of oscillator 4 being a voltage controlled oscillator (VCO) or a current controlled oscillator (ICO). The reset signal of counter 5 is driven by the oscillator output 9. Table 1 in the next page illustrates the changes in the four output bits of counter 5 during consecutive clock cycles.

The operation of counter 5 can be summarized as follows. When the crystal clock 6 is present, if the Pout 9 is high, counter 5 counts from "1111" to "0000." If Pout 9 is low, all output bits of counter 5, i.e. Q3, Q2, Q1 and Q0 are all high. As can be observed from Table 1, Q3 10 is high for eight clock cycles and low for eight cycles. This fact forms a basis of the present invention.

TABLE I

| Q3 | Q2 | Q1 | Q0 | |
|----|----|----|----|----|
| 1 | 1 | 1 | 1 | ← INITIAL STATE |
| 1 | 1 | 1 | 0 | |
| 1 | 1 | 0 | 1 | |
| 1 | 1 | 0 | 0 | |
| 1 | 0 | 1 | 1 | |
| 1 | 0 | 1 | 0 | countdown |
| 1 | 0 | 0 | 1 | |
| 1 | 0 | 0 | 0 | |
| 0 | 1 | 1 | 1 | |
| 0 | 1 | 1 | 0 | |
| 0 | 1 | 0 | 1 | |
| 0 | 1 | 0 | 0 | |
| 0 | 0 | 1 | 1 | |
| 0 | 0 | 1 | 0 | |
| 0 | 0 | 0 | 1 | |
| 0 | 0 | 0 | 0 | |

Figure 3:
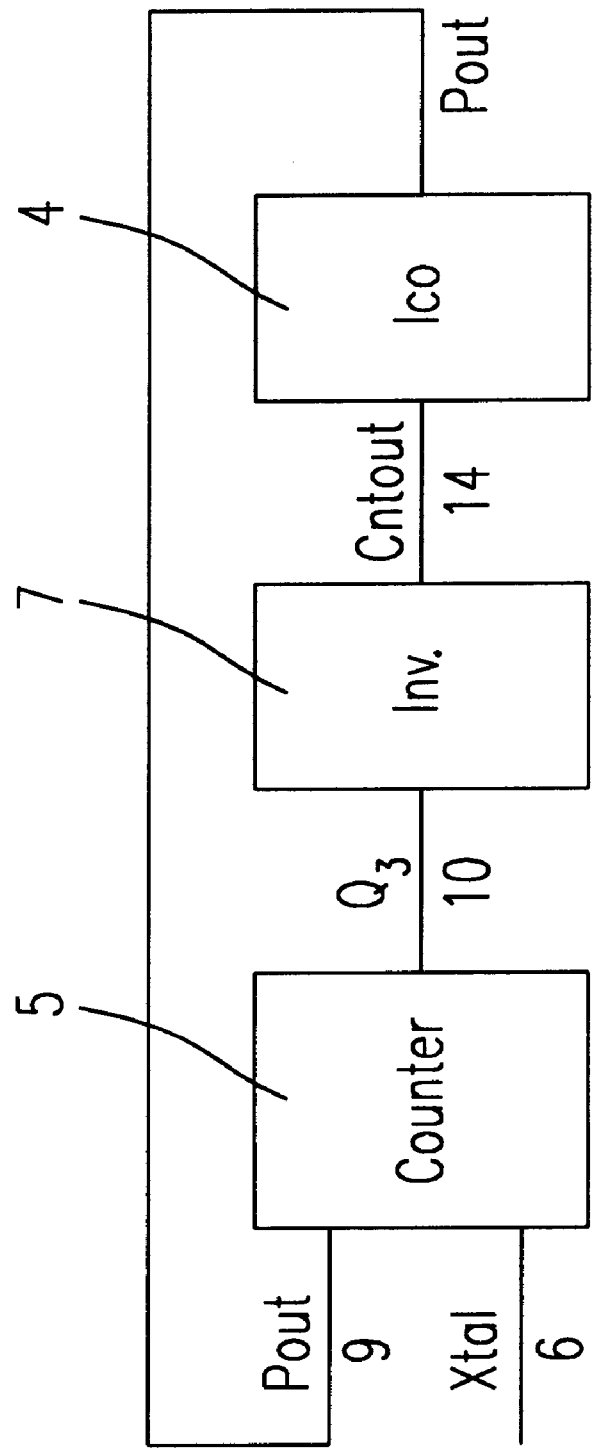
FIG. 3 is a schematical block diagram showing a preferred embodiment of a reliable oscillating device according to the present invention.

FIG. 3 illutrates the new approach used for a start up circuit or a reliable oscillating device according to the present invention. With reference to this figure, operation of counter 5 will be discussed. The inverter 7 inverts the logic state of Q3 10 to generate a Cntout signal 14 serving as a reset signal to trigger oscillator 4 to start up. Depending on its logic level, Cntout 14 governs the fixed/oscillatory mode of oscillator 4 so that Cntout 14 will release oscillator 4 to an oscillatory state if signal Cntout 14 is low and will hold oscillator 4 (e.g. a five stage basic differential ring oscillator) in a fixed mode if Cntout signal 14 is high. Output Pout 9 represents the output of oscillator 4 after a differential to single-ended conversion. Pout 9 remains high when oscillator 4 is held in the fixed mode.

Figure 4:
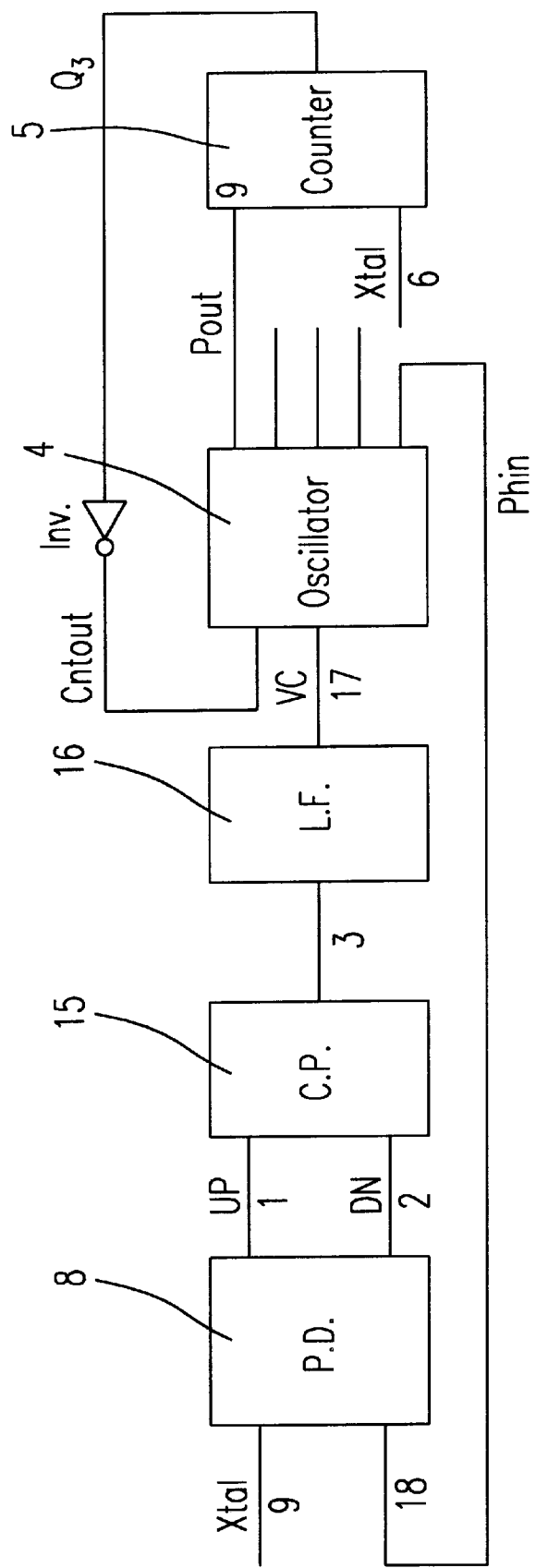
FIG. 4 schematically illustrates that a reliable oscillating device in FIG. 3 is implemented into a phase locked loop circuit according to the present invention.

As shown in FIG. 4, the above-described start up circuit is incorporated as a part of a phase locked loop (PLL) circuit device generally including a phase detector (P.D.) 8, a charge pump (C.P.) 15 and a loop filter (L.F.) 16 in which the output Phin 18 of oscillator 4 is used as an input for phase detector 8.

The present start up circuit functions in the following manner. When the power supply Vdd is rising, Pout 9 also rises. When Pout 9 is sufficiently high for the flip-flops in counter 5 to start functioning, counter 5 starts counting. Q3 10 is held high for eight clock cycles so that Cntout 14 is low and oscillator 4 is free to start oscillations. If oscillator 4 does not oscillate, either due to there is an insufficient control voltage or because it is operating in the stable region, Pout 9 remains high so that Q3 10 is low for eight crystal cycles. The control voltage tries to rise during this period and oscillator 4 remains in a fixed state. Q3 10 then goes high after eight crystal cycles. The above-mentioned cycle is then repeated. This process continues until an enough control voltage Vc 17 is built-up for oscillator 4 to start oscillating.

When oscillator 4 oscillates at a very low frequency with respect to reference crystal 60, Cntout 14 keeps changing its state between high and low. Oscillator 4 is then either in a fixed mode or an oscillatory state. When oscillator 4 oscillates at a sufficiently high frequency so as to reset counter 5 before Q3 10 changes from 1 to 0, Cntout 14 will thus remain low under normal operation conditions of the PLL circuit device in FIG. 4.

Referring now back to FIG. 1 showing the basic structure of the present reliable oscillating device, voltage states of the third state and the fourth state of detecting output Cntout 14 in this specific embodiment are respectively low and high. In the disclosed embodiment, voltage states of the first state and the second state of oscillator output Pout 9 are respectively low and high so that detecting output Cntout 14 is in the third state (oscillatory), oscillator output Pout 9 is in the first state (low), and when detecting output Pout 9 is in the fourth state, oscillator output Pout 9 is in the second state (high).

In the present instance, the first work mode and the second work mode are respectively an oscillatory mode and a fixed mode wherein in the oscillatory mode, the oscillator oscillates in a manner that the oscillator is assumed to oscillate whereas in the fixed mode, the oscillator does not oscillate. During power-up/reset the oscillator oscillates at a frequency lower than that at which oscillator 4 is assumed to oscillate.

Counter 5 is a 4-bit down counter for counting $2^4$ (or 16) clock cycles, and has a most significant bit (MSB) Q3 10 to provide detecting output Cntout 14. Reference crystal 60 for clocking counter 5 can be a 20-time one.

Metaphysically speaking, a start up circuit adapted to be used with an oscillator 4 having an oscillator output Pout 9 having a first state in a first instance and a second state in a second instance according to the present invention includes a detecting device 57 which includes a first input end Pout 9 for inputting therethrough the oscillator output Pout 9, a detecting output Cntout 14 having a third state in a third instance and a fourth state in a fourth instance such that when the detecting output Cntout 14 is in the third state, oscillator 4 is in a first work mode, and when detecting output Cntout 14 is in the fourth state, oscillator 4 is in a second work mode, and a second input for inputting therethrough a crystal clock Xtal 6 generated by a reference crystal 60.

Methodologically speaking, a method for oscillating an oscillator 4 having an oscillator output includes steps of detecting whether oscillator 4 is regularly oscillating, and releasing oscillator 4 to oscillate when oscillator 4 is regularly oscillating, and holding oscillator 4 from oscillating until an enough control voltage Vc is built-up therefor when oscillator 4 is not regularly oscillating.

The above-described steps can be performed by a detecting device 57 which includes a first input end Pout 9 for inputting therethrough the oscillator output having a first state in a first instance and a second state in a second instance, and a detecting output Cntout 14 having a third state in a third instance and a fourth state in a fourth instance such that when detecting output Cntout 14 is in the third state, oscillator 4 is in a first work mode, and when detecting output Cntout 14 is in the fourth state, oscillator 4 is in a second work mode.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A reliable oscillating device comprising:
    an oscillator having an oscillator output having a first state in a first instance and a second state in a second instance; and
    a detecting device electrically connected to said oscillator, detecting which one of said first and second states said oscillator output is in, and having a detecting output having a third state in a third instance and a fourth state in a fourth instance such that when said detecting output is in said third state, said oscillator is in a first work mode, and when said detecting output is in said fourth state, said oscillator is in a second work mode.

2. A device according to claim 1 wherein voltage states of said third state and said fourth state are respectively low and high.

3. A device according to claim 2 wherein when said detecting output is in said third state, said oscillator output is in said first state, and when said detecting output is in said fourth state, said oscillator output is in said second state.

4. A device according to claim 3 wherein voltage states of said first state and said second state are respectively low and high.

5. A device according to claim 4 wherein said first work mode and said second work mode are respectively an oscillatory mode and a fixed mode.

6. A device according to claim 5 wherein in said oscillatory mode, said oscillator oscillates in a manner that said oscillator is assumed to oscillate.

7. A device according to claim 6 wherein in said fixed mode, said oscillator does not oscillate.

8. A device according to claim 6 wherein in said fixed mode, said oscillator oscillates at a frequency lower than that at which said oscillator is assumed to oscillate.

9. A device according to claim 8 wherein in said fixed mode, said detecting output keeps changing between said third state and said fourth state.

10. A device according to claim 1 wherein said detecting device includes a counter.

11. A device according to claim 10 wherein said counter is a ripple counter.

12. A device according to claim 10 wherein said counter is an n bit down counter for counting $2^n$ clock cycles, and has a most significant bit (MSB).

13. A device according to claim 12 wherein said n is 4.

14. A device according to claim 12 wherein said detecting device further includes an inverter for inverting a logic state of said most significant bit to provide said detecting output.

15. A device according to claim 1 wherein said oscillator is a differential oscillator.

16. A device according to claim 15 wherein said oscillator is a 5 stage basic differential ring oscillator.

17. A device according to claim 1, further comprising a 20 MHz time reference crystal.

18. A device according to claim 1, incorporated into a phase locked loop circuit device.

19. A device according to claim 18 wherein said phase locked loop circuit device includes a phase detector, a charge pump and a loop filter.

20. A device according to claim 19 wherein said oscillator has an output used as an input to said phase detector.

21. A start up circuit adapted to be used with an oscillator having an oscillator output having a first state in a first instance and a second state in a second instance, comprising a detecting device which includes:
   a first input end for inputting therethrough said oscillator output; and
   a detecting output having a third state in a third instance and a fourth state in a fourth instance such that when said detecting output is in said third state, said oscillator is in a first work mode, and when said detecting output is in said fourth state, said oscillator is in a second work mode.

22. A circuit according to claim 21 wherein said detecting device further includes a second input for inputting therethrough a crystal clock.

23. A circuit according to claim 21 wherein said detecting device includes a counter.

24. A circuit according to claim 23 wherein said counter is an n bit down counter for counting $2^n$ clock cycles, and has a most significant bit (MSB).

25. A circuit according to claim 24 wherein said detecting device further includes an inverter for inverting a logic state of said most significant bit to provide said detecting output.

26. A circuit according to claim 21 wherein said oscillator is a differential oscillator.

27. A circuit according to claim 26 wherein said oscillator provides said oscillator output through a differential to single-ended conversion.

28. A method for oscillating an oscillator having an oscillator output comprising steps of:
   detecting whether said oscillator is regularly oscillating; and
   releasing said oscillator to oscillate when said oscillator is regularly oscillating, and holding said oscillator from oscillating until an enough control voltage is built-up therefor when said oscillator is not regularly oscillating.

29. A method according to claim 28 wherein said steps are performed by a detecting device which includes:
   a first input end for inputting therethrough said oscillator output having a first state in a first instance and a second state in a second instance; and
   a detecting output having a third state in a third instance and a fourth state in a fourth instance such that when said detecting output is in said third state, said oscillator is in a first work mode, and when said detecting output is in said fourth state, said oscillator is in a second work mode.

30. A method according to claim 29 wherein said first work mode and said second work mode are respectively an oscillatory mode and a fixed mode.

31. A method according to claim 30 wherein in said fixed mode, said oscillator does not oscillate.

32. A method according to claim 30 wherein in said fixed mode, said oscillator oscillates at a frequency lower than that at which said oscillator is assumed to oscillate.

33. A method according to claim 30 wherein said detecting device includes a counter.

34. A method according to claim 33 wherein when said oscillator is in said fixed mode, said control voltage is rising.

35. A method according to claim 34 wherein said counter will periodically count, during which period said control voltage will change.

36. A method according to claim 35 wherein said detecting device further includes a reference crystal for clocking said counter.

* * * * *

UNITED STATES PATENT AND TRADEMARK OFFICE
CERTIFICATE OF CORRECTION

PATENT NO. : 6,011,445
DATED : January 4, 2000
INVENTOR(S) : Vaishali Nikhade; Khosrow Sadeghi It is certified that error appears in the above-identified patent and that said Letters Patent is hereby corrected as shown below:

Title Page:
[22] delete "August 1, 1998" and insert --September 1, 1998--

Signed and Sealed this

Seventeenth Day of April, 2001

*Attest:*

NICHOLAS P. GODICI

*Attesting Officer*   *Acting Director of the United States Patent and Trademark Office*